United States Patent [19]

Gill et al.

[11] Patent Number: 5,309,022
[45] Date of Patent: May 3, 1994

[54] NI-GE-AU OHMIC CONTACTS FOR GAAS AND GAALAS

[75] Inventors: Sukhdev S. Gill, West Midlands; Mark A. Crouch; John R. Dawsey, both of Worcs, all of England

[73] Assignee: The Secretary of State for Defence in Her Britannic Majesty's Government of the United Kingdom of Great Britain and Northern Ireland, London, England

[21] Appl. No.: 834,561

[22] PCT Filed: Sep. 7, 1990

[86] PCT No.: PCT/GB90/01382

§ 371 Date: Feb. 14, 1992

§ 102(e) Date: Feb. 14, 1992

[87] PCT Pub. No.: WO91/04578

PCT Pub. Date: Apr. 4, 1991

[30] Foreign Application Priority Data

Sep. 15, 1989 [GB] United Kingdom ............ 8921004

[51] Int. Cl.$^5$ ............................................ H01L 29/46
[52] U.S. Cl. .................................. 257/743; 257/745; 437/184
[58] Field of Search ............. 437/184; 257/742, 745, 257/743

[56] References Cited

U.S. PATENT DOCUMENTS

5,063,174  11/1991  Beyea et al. ................ 437/184
5,077,597  12/1991  Yano et al. .................. 437/184

FOREIGN PATENT DOCUMENTS

0001230  1/1989  Japan ......................... 437/184
WO-A-8303713  10/1983  PCT Int'l Appl. .

OTHER PUBLICATIONS

IEEE Transactions on Electron Devices, vol. ED-34, No. 4, Apr. 1987, "Gold-Germanium-Based Ohmic Contacts to the Two-Dimensional Electron Gas at Selectively Doped Semiconductor Heterointerfaces", pp. 765–771.

J. Appl. Phys. 61, "Transmission-Electron Microscope Studies of Au-Ni-Ge Based Ohmic Contracts to GaAs-AlGaAs MODFET Device", pp. 4682–4688, May 1987 A. K. Rai et al.

IEEE Transactions on Electron Devices, vol. 36, No. 2, Feb. 1989, IEEE, (N.Y., N.Y.), H. Goronkin et al "Ohmic Contact Penetration and Encroachment in GaAs/AlGaAs and GaAs FET's", pp. 281–288.

Thin Solid Films, vol. 176, No. 1, Sep. 1, 1989, Elsevier Sequoia, (Lausanne, CH) R. K. Ball "Improvements in Topography of AuGeNi-based . . . n-GaAs", pp. 55–68

International Search Report.

*Primary Examiner*—Olik Chaudhuri
*Assistant Examiner*—Long Pham
*Attorney, Agent, or Firm*—Nixon & Vanderhye

[57] ABSTRACT

A low resistance ohmic contact for n-type GaAs and GaAlAs is provided by Ni-Ge-Au structure (1). The contact is suitable for device substrates (2) which have carrier concentrations of between about $10^{17}$ cm$^{-3}$ and about $10^{19}$ cm$^{-3}$. The ohmic contact has a nickel layer of between 40 Å and 200 Å deposited on the substrate, followed by a Ge deposition (4) of between 150 Å and 400 Å and finally an Au deposition (5, 6) of greater than 4000 Å. The Au layer is preferably deposited in two separate layers of between 500 Å and 1000 Å, (5), and greater than 4000 Å, (6). A preferred construction (1) is 50 Å/200 Å/800 Å+5000 Å (Ni/Ge/Au+Au). The ohmic contact deposition must be followed by annealing, typically at temperatures between 300° C. and 500° C. for times of between 1 second and 200 seconds. The preferred annealing conditions are a temperature of 400° C. maintained for 15 seconds.

4 Claims, 4 Drawing Sheets

NI-GE-AU OHMIC CONTACTS FOR GAAS AND GAALAS

BACKGROUND OF THE INVENTION

1. Field of the Invention

This invention relates to ohmic contacts used on n-type GaAs and GaAlAs devices.

2. Discussion of Prior Art

GaAs and GaAlAs are preferred materials for the manufacture of high speed devices such as bipolar transistors, heterojunction bipolar transistors or high mobility electron transistors. However, for efficient use of the higher device operating speeds of such materials, it is necessary to minimise the resistance of the ohmic contacts. Lower ohmic contact resistances lead to a reduction in undesirable heat production, improved frequency response and an increase in noise immunity for logic circuits.

Alloyed Ge-Au and Ni-Ge-Au films are widely used for fabricating ohmic contacts to n-type GaAs. In general, adding small amounts of Ni to Ge-Au leads to lower contact resistance as well as serving to maintain a smooth surface morphology after alloying the contact metallisation.

Heime et al (Sol. St. Electronics 17 pp 835-837 1974) have reported specific contact resistivities of $4 \times 10^{-4}$ $\Omega \text{cm}^2$ for carrier concentrations of $2 \times 10^{15}$ $\text{cm}^{-3}$ and $1 \times 10^{-6}$ $\Omega \text{cm}^2$ for carrier concentrations of $1 \times 10^{18}$ $\text{cm}^{-3}$. These values were achieved using contacts where a 50 A layer of Ni was evaporated onto GaAs, with a 700 A layer of eutectic AuGe laid on the nickel and a final 300 A Ni overplate evaporated onto the AuGe.

In 1987 Rai et al (J. App. Phys. 61(9) pp 4682-4688 1987) were able to achieve an ohmic contact resistance minimum of about 0.2 $\Omega$-mm after an alloy anneal of 420° C. Their ohmic contact metallised structure consisted of sequential electron beam deposited layers of 50 A Ni; 170 A Ge; 300 A Au; 150 A Ni; and 2000 A Au. This contact definition was deposited on n+ GaAs. A direct comparison of this reported ohmic contact resistance with that of the contacts reported by Heime et al is difficult due to the fact that Heime et al did not report the sheet resistance of the substrate material.

Further reductions in ohmic contact resistance are reported in J. Vac.. Sci. Technol. B4(4) pp 903-911 1986 by Murkami et al. Three different ohmic contact constructions were detailed, each deposited on GaAs implanted to contain $1 \times 10^{18}$ $\text{cm}^{-3}$ carriers. The mean contact resistance of each type of contact construction was about 0.1 -mm or slightly greater. Type A sample was prepared by sequentially depositing a 1000 Å Au-Ge layer followed by 350 Å Ni and 500 Å Au layers. Sample types B and C were prepared by depositing 50 and 100 Å of Ni, respectively, as the first layer, followed by Au-Ge (1000 Å thick), Ni (300 Å and 250 Å thick respectively) and Au (500 Å thick) layers.

Ohmic contacts may also be made to n-type GaAlAs layers by the use of a thin buffer GaAs contact layer. The buffer layer prevents oxidation of Al and also helps to improve adhesion.

SUMMARY OF THE INVENTION

The object of this invention is to provide ohmic contacts with reduced contact resistance, and hence ohmic contacts which are more suitable for n-type GaAs and AlGaAs device fabrication. The invention may be produced by the use of conventional GaAs and AlGaAs technology.

According to this invention a low resistance ohmic contact for n-type GaAs and GaAlAs comprises:

multiple layers of Ni-Ge-Au contacts on an n-type GaAs substrate or an n-type GaAlAs substrate with a thin buffer GaAs contact layer, characterised by said contact comprising a first layer of Ni of thickness between 40 Å and 200 Å deposited on the substrate, a second layer of Ge of thickness between 150 Å and 400 Å and third layer of Au of thickness greater than 4000 Å, and said layers being annealed.

A preferred method of construction is to form the gold layer in two separate gold layers, the first being between 500 Å and 1000 Å thick and the second being a minimum of 4000 Å thick.

Following the laying down of the contact metallisation it is necessary to anneal the contact. This process is used to alloy the laid down metallisation into the substrate to give the required ohmic behaviour and a low contact-substrate contact resistance. Typical annealing temperatures are between 300° C. and 500° C. The contact is annealed for a length of time of between 1 second and 200 seconds. Preferred annealing conditions are a temperature of about 400° C. maintained for about 15 seconds.

Suitable methods of producing the ohmic contacts include electron beam evaporation thermal evaporation and sputter coating. The preferred method for the production of ohmic contacts is that of using electron beam evaporation to deposit the nickel, germanium and first gold layers. In this first evaporation sufficient gold is deposited to protect the nickel and germanium layers from the ambient environment outside the evaporation equipment. This is followed by a second electron beam evaporation or thermal evaporation process to deposit the thicker second layer of gold. The second layer is most conveniently carried out in a separate electron beam evaporator which is designed to prevent overheating of the substrate and eliminate spitting of gold during evaporation.

The preferred construction of an ohmic contact for n-type GaAs is 50 A/200 A/800 A+5000 A (Ni/-Ge/Au+Au).

The purity of the contact materials prior to use is typically about 99.999%.

Typical carrier concentrations for GaAs and GaAlAs substrate suitable for this construction of ohmic contact are in the range of $10^{17}$ $\text{cm}^{-3}$ and $10^{19}$ $\text{cm}^{-3}$.

BRIEF DESCRIPTION OF THE DRAWINGS

The invention will now be further described by example only with reference to the following figures.

DETAILED DISCUSSION OF PREFERRED EMBODIMENTS

Figure 1:
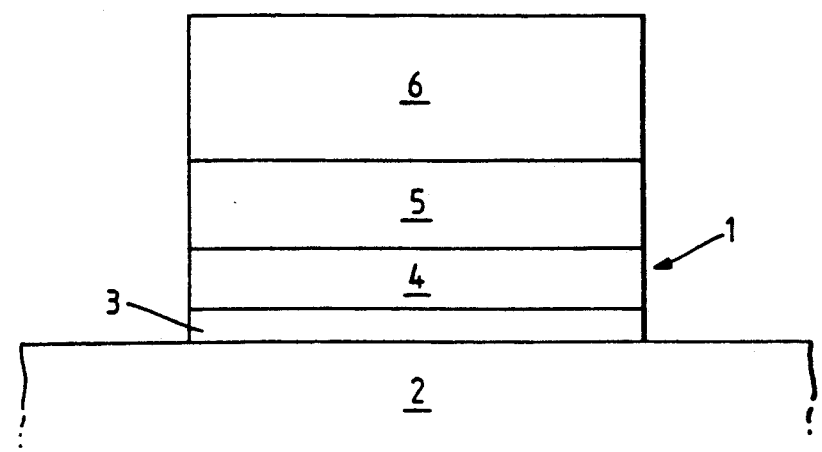
FIG. 1 is a cross section of a preferred ohmic contact construction.

A cross section of the preferred construction of ohmic contact 1 may be seen in FIG. 1. Material for device substrate wafer 2 is typically Si doped n-type GaAs, with carrier densities of about $2 \times 10^{18}$ cm$^{-3}$, as characterised by Hall measurements. Sequential layers of 50 A nickel, 3, 200 A germanium, 4, and 800+5000 A gold, 5 and 6, are deposited by an electron beam evaporation process.

Prior to ohmic pattern definition, substrate wafers are cleaned with a solvent spray for 60 seconds, suitable cleaning solvents being acetone or isopropyl alcohol. After cleaning the definition of areas of the substrate wafer onto which the ohmic contacts are to be deposited is carried out, often by a process such as lithography. At this point the wafer may be either stored for future processing or alternatively be used immediately in the ohmic contact deposition process.

The first step in the ohmic contact process is the deoxidation of the wafer 2. This may be carried out in a bath of 10% NH$_4$ in deionised water for approximately 30 seconds. The wafer is then dried, most conveniently by blowing nitrogen gas over the substrate, and transferred onto a jig. The jig is placed in an electron beam evaporator, such as may be seen schematically in FIG. 2. The drying and transfer of the wafer into the evaporator is carried out as quickly as possible in order to minimise the reoxidation of the wafer surface in the free environment.

Figure 2:
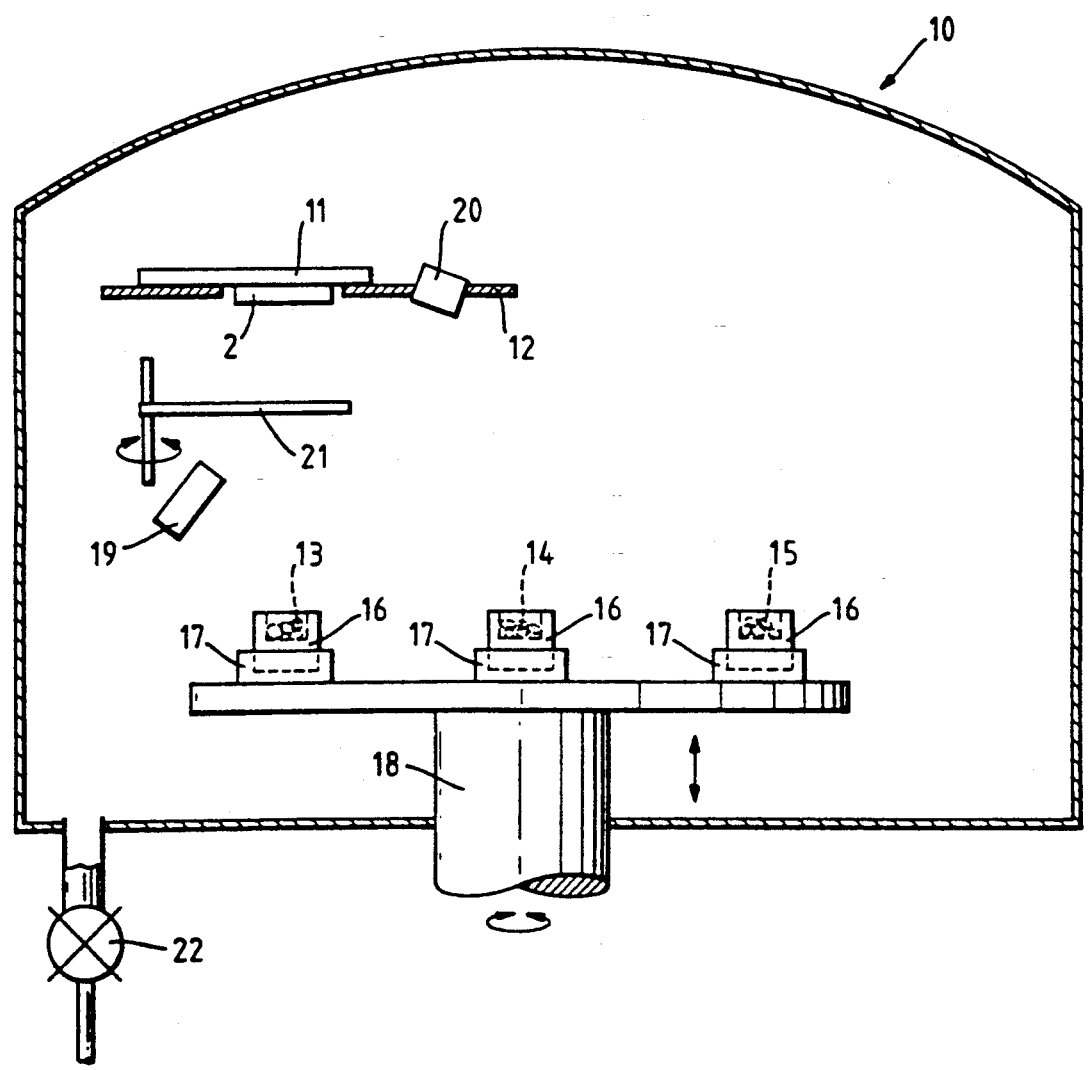
FIG. 2 is a schematic representation of electron beam evaporation apparatus used to lay down ohmic contact material.

FIG. 2 is a schematic representation of an electron beam evaporator 10 which may be used depoit nickel, germanium and gold layers on wafer 2. Jig 11, which is carrying the wafer, is placed on a holder 12. The evaporator is pumped down by pump 22 to a vacuum of 10$^{-6}$ Torr or better. Slugs of nickel 13, germanium 14, and gold 15 are each held in vitreous graphite crucibles 16. The crucibles are each held in a locator 17 which are attached to a carousel 18. Directly above one of the locators there is an electron beam source 19.

The carousel 18 is rotated to place the nickel bearing crucible under the electron beam source. To achieve sufficient power density to melt the metals the carousel is raised such that the graphite crucible is near the electron source. The electron beam source 19 is then turned on and the nickel heated. Monitoring of the deposition rate and thickness of material is carried out by the use of crystal monitor 20. The wafer 2 is protected from the evaporated material by shutter 21. When the laying down rate is sufficiently high (typically about 10 A per second), the shutter is rotated away to reveal the wafer surface to the evaporated material. The thickness of the deposited material is monitored by the crystal monitor, with the shutter rotated back to shield the wafer 2 when 50 A of nickel has been laid down. The source is then turned off and the carousel lowered and rotated to place the germanium bearing crucible under the electron beam source. The evaporation process is then repeated to deposit 200 A of germanium. The same steps are also followed for evaporation of a 500 A gold layer, except that the deposition rate is controlled to be about 5 A per second due to the increased tendency for gold to spit during evaporation.

After returning the evaporator 10 to ambient air pressure, the jig 11 holding wafer 2 is transferred as quickly as possible to another electron beam evaporator, which is also then pumped down to a vacuum of 10$^{-6}$ Torr or better. The second electron beam evaporator is preferably a large evaporator which is capable of ensuring that the wafer is not overheated during the deposition of the thick gold layer and also of eliminating the likelihood of the gold spitting during the evaporation process. The evaporation conditions for the second gold layer are as described above for the deposition of the first gold layer.

Figure 3:
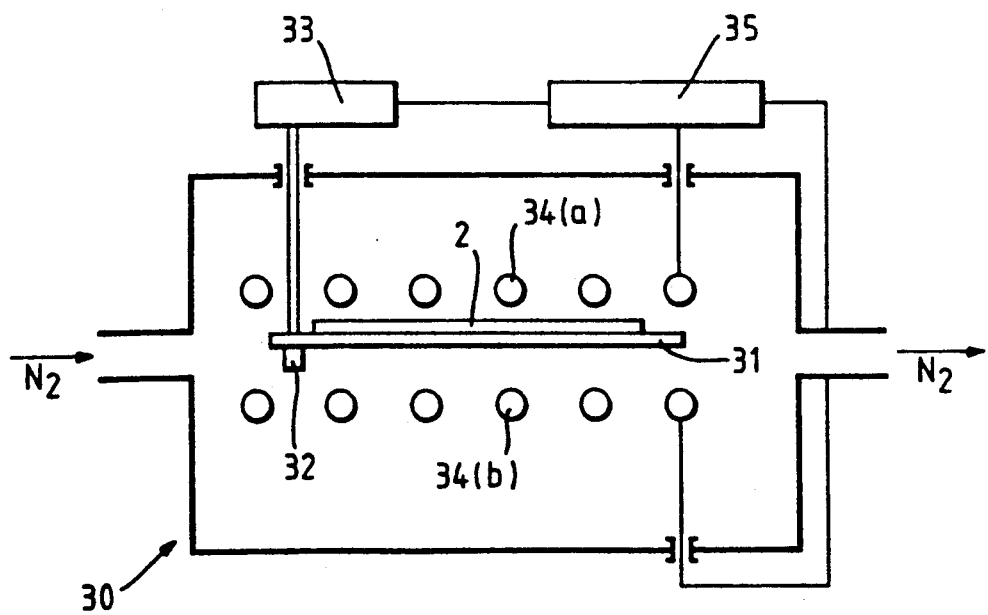
FIG. 3 is a schematic representation of a rapid anneal system.

FIG. 3 shows schematically a rapid thermal anneal system 30. The system is used to alloy the deposited metallisation into the substrate 2 to give the required ohmic behaviour and a low contact-substrate resistance. Following deposition of the nickel, germanium and two gold layers, the wafer 2 is taken off the jig 11 and placed, with the uncontacted surface uppermost, on a silicon holder 31 which has an integral thermocouple 32. The silicon holder is then placed in the rapid anneal system with the contact layers on the wafer surface facing downwards. The thermocouple is then attached to a temperature monitoring and controlling unit 33. The laminar flow of nitrogen gas is fed through the rapid anneal system and two banks of infrared lamps 34($a$) and 34($b$) are energised by power source 35. The monitoring and control unit is then programmed to allow the lamps to heat the silicon holder to a temperature of between 300° C. and 500° C. (as measured by the thermocouple) at a rate of about 130° C. and to maintain the designated temperature for a time of between 1 second and 200 seconds. The preferred conditions of anneal is a temperature of about 400° C. held for about 15 seconds. At the end of the anneal the lamps are turned off and the silicon holder and wafer allowed to return to room temperature.

Contact quality is assessed on transmission variable gap structures fabricated on the substrate wafers such as wafer 2. By using a computer controlled autoprobing facility all such structures across a wafer may be measured for both contact resistance and specific contact resistivity.

Figure 4:
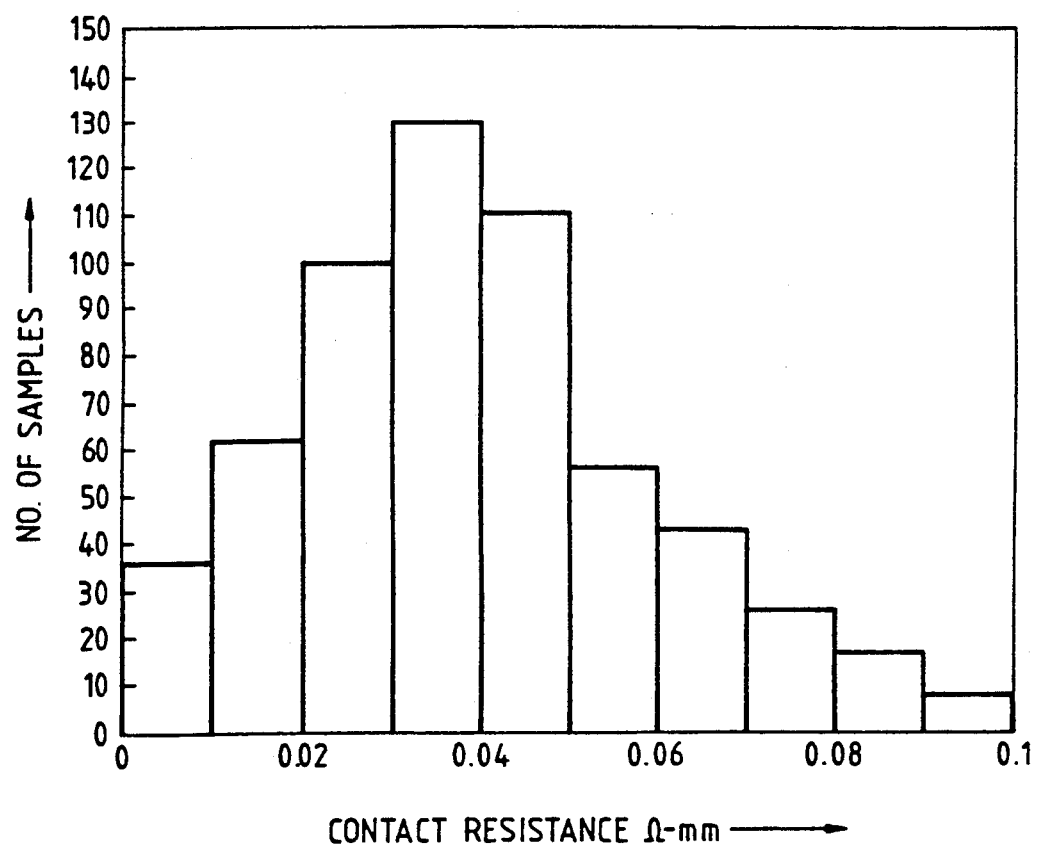
FIG. 4 is a histogram of a typical spread of contact resistance values achieved by using the described technique.

FIG. 4 is a histogram showing typical distribution of contact resistance ($\Omega$-mm) of ohmic contacts of the preferred metallisation scheme on a typical n-type GaAs substrate of carrier concentration $2 \times 10^{18}$ cm$^{-3}$. The contacts were manufactured using the processing steps described above. The mean contact resistance is about 0.045 $\Omega$-mm.

Figure 5:
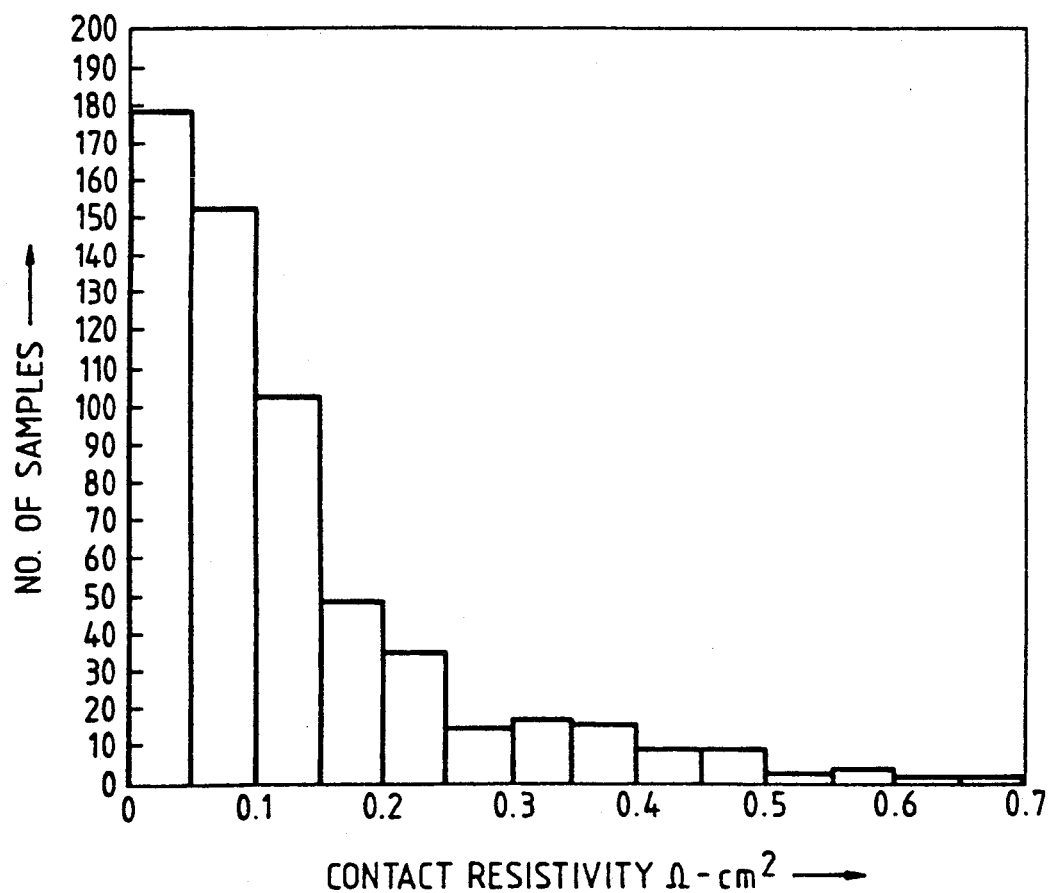
FIG. 5 is a histogram of a typical spread of specific contact resistivity values achieved by using the described technique.

FIG. 5 is a histogram of a typical distribution of specific contact resistivity ($\Omega$-cm$^2$) of ohmmic contacts of the preferred metallisation scheme on a typical n-type GaAs substrate of carrier concentration $2 \times 10^{18}$ cm$^{-3}$. The contacts were manufactured using the process steps described above.

We claim:

1. A low resistance ohmic contact for n-type GaAs and n-type GaAlAs comprising:
   multiple layers of Ni-Ge-Au contacts on an n-type GaAs substrate or an n-type GaAlAs substrate with a thin buffer GaAs contact layer,
   characterised by said contact comprising
   a first layer of Ni of thickness between 40 Å and 200 Å deposited on on the substrate, a second layer of Ge of thickness between 150 Å and 400 Å and third layer of Au of thickness greater than 4000 Å, and said layers being annealed.

2. An ohmic contact according to claim 1 where the contact has said Ni layer of 50 Å, said Ge layer of 200 Å and said gold layer formed of two separate layers of 800 Å and 5000 Å.

3. An ohmic contact according to claim 1 where the annealing is carried out at a temperature of between 300° C. and 500° C. and for a time of between 1 second and 200 seconds.

4. An ohmic contact according to claim 2 where the annealing is carried out at a temperature of about 400° C. for about 15 seconds.

* * * * *